United States Patent [19]
Edwards et al.

[11] Patent Number: 6,097,603
[45] Date of Patent: Aug. 1, 2000

[54] HEAT SINK FOR DIRECT ATTACHMENT TO SURFACE MOUNT ELECTRONIC DEVICE PACKAGES

[75] Inventors: Steven Fields Edwards, Dallas; Donald Lynn Clemens, The Colony; Gary Kuzmin, Plano, all of Tex.

[73] Assignee: Thermalloy, Incorporated, Dallas, Tex.

[21] Appl. No.: 08/955,481

[22] Filed: Oct. 22, 1997

[51] Int. Cl.[7] .................................................. H05K 7/20
[52] U.S. Cl. ..................... 361/719; 165/80.3; 174/16.3; 361/704
[58] Field of Search .................. 257/706, 707, 257/713, 718, 719, 727; 174/16.3, 252; 165/80.3, 185; 361/690, 697, 702–705, 715, 717–719

[56] References Cited

U.S. PATENT DOCUMENTS

| | | |
|---|---|---|
| 3,572,428 | 3/1971 | Monaco . |
| 3,670,215 | 6/1972 | Wilkens . |
| 4,521,828 | 6/1985 | Fanning . |
| 4,544,942 | 10/1985 | McCarthy . |
| 4,914,551 | 4/1990 | Anschel . |
| 5,546,275 | 8/1996 | Moutrie . |
| 5,611,393 | 3/1997 | Vasconcelos . |
| 5,647,748 | 7/1997 | Mills . |
| 5,710,745 | 1/1998 | Getreuer . |
| 5,804,875 | 9/1998 | Remsburg . |

*Primary Examiner*—Gerald Tolin
*Attorney, Agent, or Firm*—Cohen, Pontani, Lieberman & Pavane

[57] ABSTRACT

A heat sink adapted to thermally couple to a surface mounted heat generating electronic device package in a manner which provides an increased thermal path between the heat sink and the electronic device package. The heat sink is typically mounted piggyback on a heat generating electronic device package which is surface mounted to a printed circuit board or other substrate. The heat sink comprises thermal legs which extend from the heat sink body and are thermally coupled to thermal leads of the heat generating electronic device package.

5 Claims, 6 Drawing Sheets

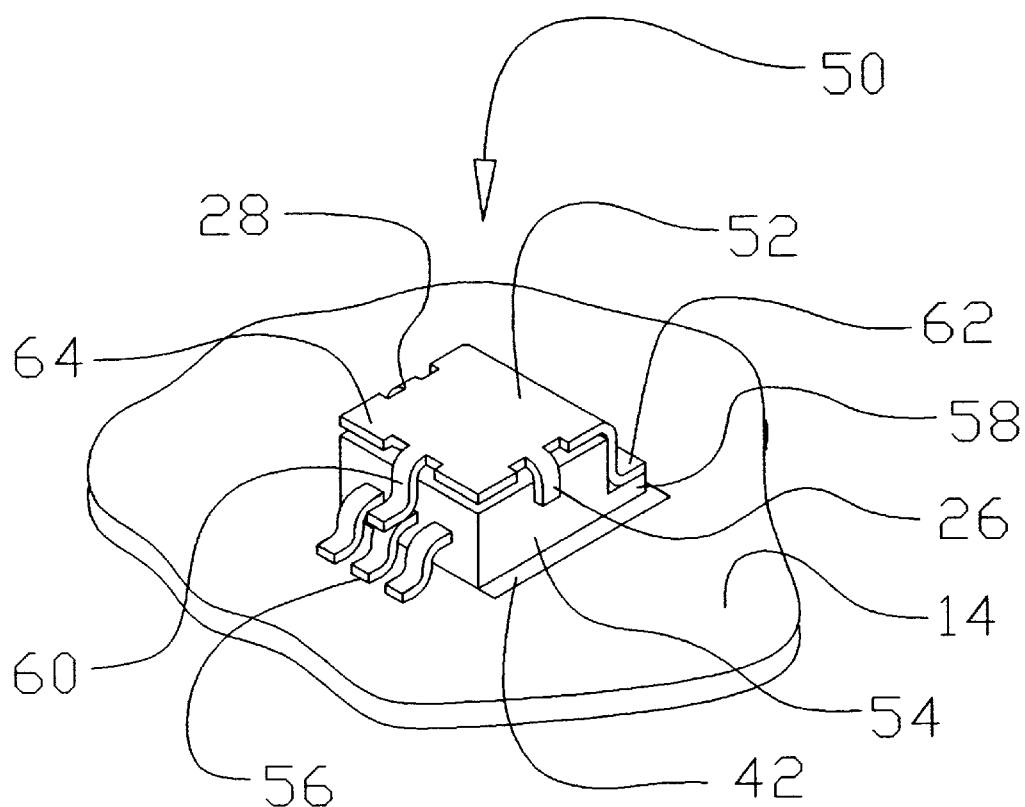
FIG. 3a
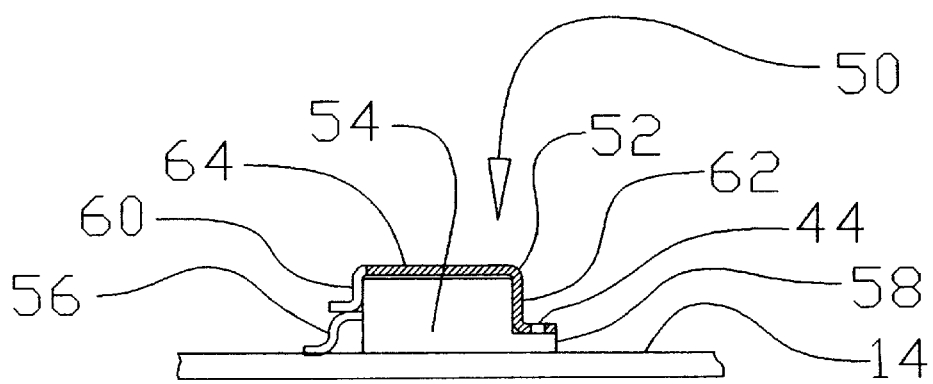
FIG. 3b
FIG. 3

HEAT SINK FOR DIRECT ATTACHMENT TO SURFACE MOUNT ELECTRONIC DEVICE PACKAGES

FIELD OF THE INVENTION

The present invention relates to a heat sink adapted to thermally couple directly to a surface mounted heat generating electronic device package in a manner which provides an increased thermal path between the heat sink and the electronic device package. More particularly, it relates to a heat sink thermally coupled to the thermal leads of an electronic device package thereby creating a larger thermal path between the device package and the heat sink facilitating the increased dissipation of heat from the electronic device package.

BACKGROUND OF THE INVENTION

Many electronic devices and electrical systems, such as transistors, integrated circuits, power controls, switches, microprocessors, and the like, generate heat during operation. The capability of some electronic devices is limited by their ability to remove or expel internally generated heat. This heat must be removed from the device to avoid general or localized thermal degradation or failure of the device. In some devices, the heat generated is sufficiently dissipated to the surrounding environment by the enclosure, package, header, or leads. Other devices require additional apparatus, such as heat sinks, heat exchangers, etc., for removing and dissipating excess thermal energy.

For purposes of the present invention, a heat sink is any body of metal or like material which is placed in thermal communication with an electronic device package or other heat generating component for transferring internally generated heat from the device and for rapidly dissipating this heat to the surrounding environment by conduction, convection, and/or radiation. In order to accomplish this, heat sinks are generally made of materials having high coefficients of thermal conduction such as aluminum, copper, and alloys thereof. Heat sinks may be extruded, machined, molded, sawed, or formed of sheet metal bodies. A typical heat sink for electrical applications functions by conducting heat away from the heat generating component and dissipating the heat into the surrounding air. Accordingly, heat sinks are typically shaped to maximize surface area by incorporating fins or pins. Increasing the heat sink's surface area increases the heat sink's ability to dissipate heat to the surrounding atmosphere.

In order for the heat sink to operate efficiently, it must be secured to, or otherwise placed in good thermal communication with, the heat generating device. Various means have been used to attach heat sinks in thermal communication with heat generating device packages. A known practice is to glue, solder, or otherwise adhere a heat sink directly to a predetermined surface of the body of a heat generating device package with heat-conductive epoxy, solder paste, thermally enhanced adhesives, or the like. Heat sinks may also be mechanically attached to electronic device packages with resilient metal clips mounted on the heat sink or with screws, bolts, clamps, or other connective means which urge the heat sink and electronic device package into mutual physical contact. In addition, heat sinks may be remotely located but thermally coupled to a heat generating device via a heat spreader device, a heat pipe, or any other means of transferring heat from the source of the heat to the heat sink.

Recently, technological advances have allowed electronic components to decrease in size while significantly increasing in power and speed. This miniaturization of electronic components with increased capability has resulted in the generation of more heat in less space with the electronic device packages having less physical structure for dissipating heat and less surface area for attaching a heat sink to dissipate the heat. The reduction of surface area available to attach a heat sink or other heat dissipating device effectively reduces the thermal path for the heat to move from the heat generating device to the heat dissipating device. As used herein, "thermal path" refers to the path along which, or the heat conductive material through which, the heat is transferred from the heat generating device to the heat dissipating device (heat sink). A smaller thermal path means less heat can move from the heat generating device to the heat sink; thus, the heat is dissipated at a slower rate and ultimately less heat can be dissipated. By analogy, a smaller thermal path is similar to a smaller water pipe wherein less water can pass through it; thus, the water is transferred at a slower rate and ultimately less water can be transferred. In order to maximize the efficiency and capability of a heat dissipating assembly, one must seek to design the largest thermal path between the heat generating device and the heat sink so that all of the heat being generated can be dissipated.

Further complicating these general thermal management issues, however, is the growing preference for surface mounting electronic components on printed circuit boards (PCBs) or other substrates. The use of surface mount PCBs is desirable because it is a less costly and less time consuming process of fabricating and populating PCBs than the older manufacturing assembly process which required insertion of components through holes in the circuit board for subsequent soldering operations. Surface mount PCBs allow for the increased use of automated manufacturing and assembly techniques. In particular, surface mountable devices are typically robotically picked and placed on the PCB and then soldered to the PCB in one automated manufacturing process. In addition to reducing assembly costs, however, the surface mount technology has allowed for even greater miniaturization of the electronic device packages used on the boards. These smaller surface mount device packages further reduce the device's ability to dissipate its own heat, thus increasing the need for separate heat sinks. In addition, the smaller packages make it increasingly difficult to attach a heat sink directly to the device package. Finally, even when a heat sink can be attached directly to the heat generating device package, the size of the thermal path is limited by the available contacting surface area on the smaller device package.

Several methods have been suggested to effectively dissipate heat from these smaller surface mount electronic device packages. One common approach is to use the ground plane, or other similar thermally conductive area of the PCB (such as a thermal plane, thermal pad, or thermal land) as a rudimentary heat sink to spread and dissipate the heat directly from the PCB. If the ground plane is used as a thermal plane, heat from the electronic device package can be transferred to the thermal/ground plane via the ground leads of the electronic device package. Additionally, if the electronic device package has a collector tab, or other heat dissipating tab, this tab can be thermally coupled to the thermal plane of the PCB via a thermal pad on the surface of the PCB. Thus, the ground leads or tab of the electronic device package can be used as "thermal leads" to transfer heat from the device package to the thermal plane of the PCB. It should be noted, however, that the heat transferred to the thermal plane of the PCB must eventually be dissipated to the surrounding environment. If the thermal plane and thermal pads are incapable of adequately dissipating the heat to the surrounding atmosphere, a heat sink or other heat dissipating device may still be required. If required, a heat sink can be soldered to a thermal pad in direct, or indirect, thermal communication with the thermal plane. Although the thermal pads and heat sinks may ultimately provide adequate dissipation of the heat generated, these alternatives often consume valuable board space thereby increasing the size of the PCB or limiting the available board space for populating the PCB, both of which are undesirable side effects.

SUMMARY OF THE INVENTION

In accordance with the present invention, there is provided a novel heat sink for dissipating heat from a surface mount heat generating electronic device package wherein the heat sink is adapted to provide additional thermal connections directly to the heat generating device package. By utilizing additional thermal connections to the heat generating electronic device package, the heat sink creates a larger overall thermal path from the heat generating electronic device package to the heat sink, thereby increasing the available rate of heat dissipation and thus ultimately the amount of heat which can be dissipated. By mounting the heat sink directly to, i.e. piggyback on, the heat generating electronic device package instead of on a remote thermal pad on the PCB, this increased heat dissipation can be achieved without consuming any additional space on the PCB.

The inventive heat sink comprises a body of thermally conductive material and at least one thermal leg extending from the body, wherein the thermal leg of the heat sink is adapted to make direct thermal contact with a thermal lead of the heat generating electronic device package. The thermal lead of the heat generating electronic device package is typically either a ground lead of the device or a tab of the device package.

In an alternate embodiment, the heat sink further comprises a first alignment leg extending from the body, adapted to engage a side of the heat generating electronic device package; and a second alignment leg extending from the body, adapted to engage a different side of the heat generating electronic device package from the side engaged by the first alignment leg. These alignment legs assist in the assembly of the heat sink to the heat generating electronic device package by properly aligning the heat sink such that the thermal legs of the heat sink align with the thermal leads of the electronic device package.

In another alternate embodiment, the thermal leg of the heat sink is thermally connected to a thermal pad on the substrate as well as the thermal lead of the electronic device package.

The assembly incorporating the inventive heat sink typically comprises a substrate having an embedded ground plane or thermal plane, wherein the ground plane or thermal plane is used for heat dissipation; a heat generating electronic device package mounted to the substrate, having a thermal lead thermally connected to the thermal plane of the substrate; and a heat sink comprising a body of thermally conductive material and a thermal leg extending from the body, wherein the thermal leg of the heat sink is in direct thermal contact with the thermal lead of the heat generating electronic device package.

Various embodiments of the present invention are more completely described below in reference to the drawings.

BRIEF DESCRIPTION OF THE DRAWINGS

The invention can be more fully understood by referencing the accompanying drawings wherein:

FIG. 3(*a*) is a perspective view of a heat dissipating assembly incorporating an embodiment of the heat sink of the present invention where the electronic device package has two thermal leads, both a ground lead and a tab of the device.

FIG. 3(*b*) is a side sectional view of the embodiment of FIG. 3(*a*).

FIG. 5(*b*) is a side sectional view of the embodiment of FIG. 5(*a*).

DETAILED DESCRIPTION OF THE DRAWINGS

Figure 1:
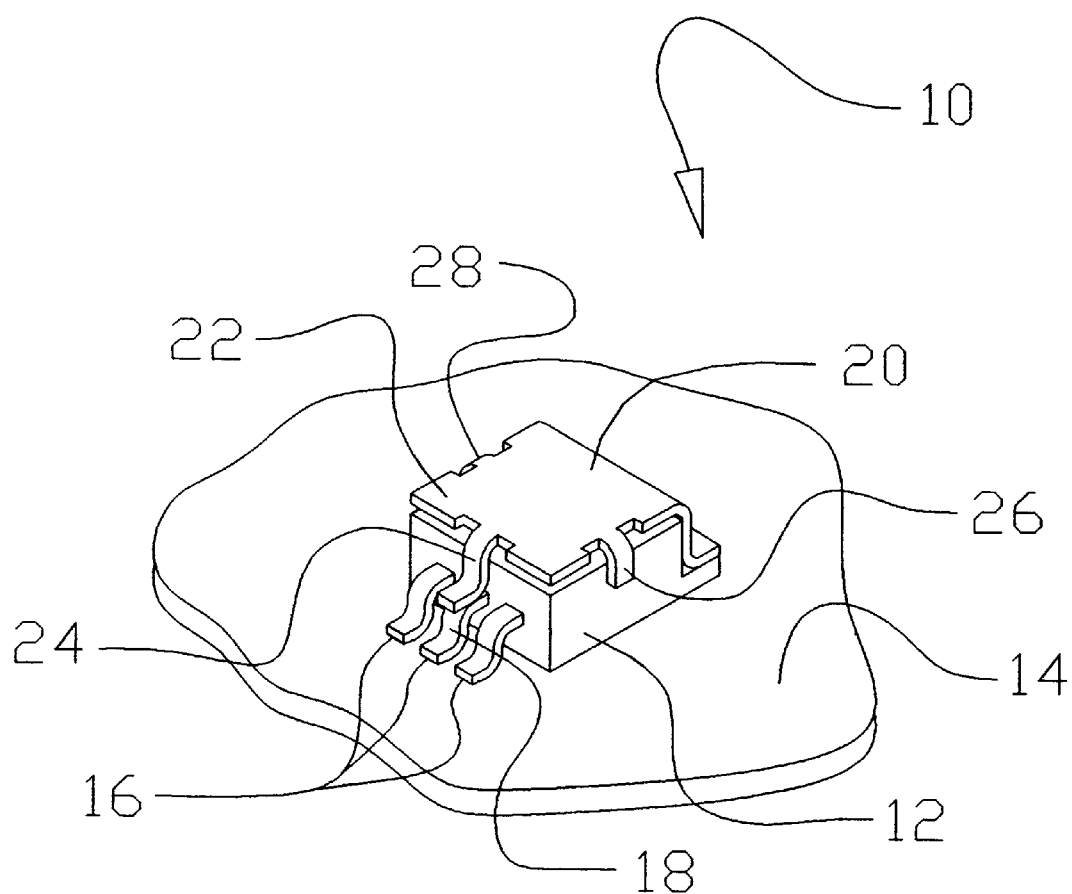
FIG. 1 is a perspective view of a heat dissipating assembly incorporating an embodiment of the heat sink of the present invention, where the thermal lead of the electronic device package is a ground lead of the device.

Referring now to the drawings, wherein like reference characters denote corresponding parts:

A heat sink assembly in accordance with the present invention is illustrated in FIG. 1.

As shown in FIG. 1, the heat dissipating assembly 10 incorporating an embodiment of the inventive heat sink 20 comprises a heat generating electronic device package 12 surface mounted to a substrate 14. The substrate 14 is typically a PCB or some similar generally planar surface used for surface mounting electronic devices. The substrate 14 does not necessarily have to include a thermal plane, however, as discussed above, the ground plane of the substrate or PCB is typically used as a thermal plane to transfer heat.

The heat generating electronic device package 12 shown in FIG. 1 has three electrical leads 16, although the invention contemplates electronic device packages having more or less leads than shown. For the device package 12 shown, the middle electrical lead is a ground lead and is electrically and thermally connected to the thermal/ground plane of substrate 14. Accordingly, this middle lead is the thermal lead 18 of the electronic device package 12.

FIG. 1 shows an embodiment of the inventive heat sink 20 mounted directly to, i.e. piggyback on, the electronic device package 12. The heat sink 20 is made of highly thermally conductive material such as copper or aluminum. The body 22 of the heat sink 20 is shown as a generally planar surface supported above the electronic device package 12; however, the body 22 may be any structurally stable configuration. The body 22 of the heat sink 20 is approximately the same dimension as the electronic device package 12 since the body 22 of the heat sink 20 does not extend significantly beyond the outer dimensions of the electronic device package 12, the heat sink 20 does not consume additional PCB space. In addition, the body 22 of the heat sink 20 can be mounted flush with the electronic device package 12 such that the bottom surface of the body 22 of the heat sink 20 is in physical contact with the top surface of the electronic device package 12. By increasing the surface area of the body 22 of the heat sink 20, however, by the use of pins, fins, or otherwise, the capacity of the heat sink 20 to dissipate heat to the surrounding environment can be increased.

Extending from the body 22 is a thermal leg 24. The thermal leg 24 extends from the body 22 of the heat sink 20 to the thermal lead 18 of the electronic device package 12 such that the thermal leg 24 is in mutual physical contact with the thermal lead 18. The thermal leg 24 is preferably thermally coupled to the thermal lead 18 using heat-conductive epoxy, other thermally enhanced adhesive, solder, etc. To increase the contact surface area between the thermal leg 24 and the thermal lead 18, the thermal leg 24 can be formed arcuate, angled, or can be otherwise shaped such that a portion of the thermal leg 24 is generally adjacent and parallel to the contacting surface of the thermal lead 18. To further increase the contact surface area between the thermal leg 24 and the thermal lead 18, the thermal leg 24 should have approximately the same width as the thermal lead 18. Ultimately, the size and shape of the thermal leg 24 should be designed to maximize the contact surface area between the thermal leg 24 and the thermal lead 18, while ensuring that the thermal leg 24 does not contact the other electrical leads 16 causing an electrical short to ground. It should also be noted, however, if adjacent electrical leads 16 are also ground leads which are used as thermal leads 18, a single thermal leg 24 from the heat sink 20 may be used to contact multiple thermal leads 18 by simply increasing the width of the thermal leg 24 to extend over the adjacent thermal leads 18. Alternatively, multiple thermal legs 24 may be formed in the heat sink 20 to contact multiple thermal leads 18, where the thermal leads 18 are adjacent or separated by other electrical leads.

Another feature of the inventive heat sink 20 shown in FIG. 1 is the first alignment leg 26 which extends from the body 22 of the heat sink 20. The first alignment leg 26 is adapted to engage a side of the heat generating electronic device package 12. A second alignment leg 28 extends from the body 22 of the heat sink 20. The second alignment leg 28 is adapted to engage the side of the heat generating electronic device package 12 opposite from the side engaged by the first alignment leg 26. Any number of alignment legs 26,28 can be formed in the heat sink 20 and can be used to engage any part of the electronic device package 12 so long as that part is not carrying an electrical current or signal such that it would be shorted by the alignment leg. The first and second alignment legs 26,28 align the heat sink 20 such that the thermal leg 24 of the heat sink 20 aligns with the thermal lead 18 of the electronic device package 12. These alignment legs 26,28 assist in the assembly of the heat sink 20 to the heat generating electronic device package 12 by properly aligning the heat sink 20. In addition, the alignment legs 26,28 serve to keep the heat sink 20 in place during the manufacturing process, thus allowing for the automated placement of the heat sink 20 on the heat generating electronic device package 12 and for a subsequent oven or heating process in which the surface mount device packages as well as the heat sink 20 can be soldered in place. In addition, the alignment legs 26,28 help ensure that the heat sink 20 will stay in place even after manufacturing, thereby preventing the thermal leg 24 from slipping into contact with other electrical leads 16 causing a short. Alternatively, a portion of the thermal leg 24 can be angled or arcuate such that it engages the side or another portion of the heat generating electronic device package 12 thereby aligning the heat sink 20 on the device package 12.

Figure 2:
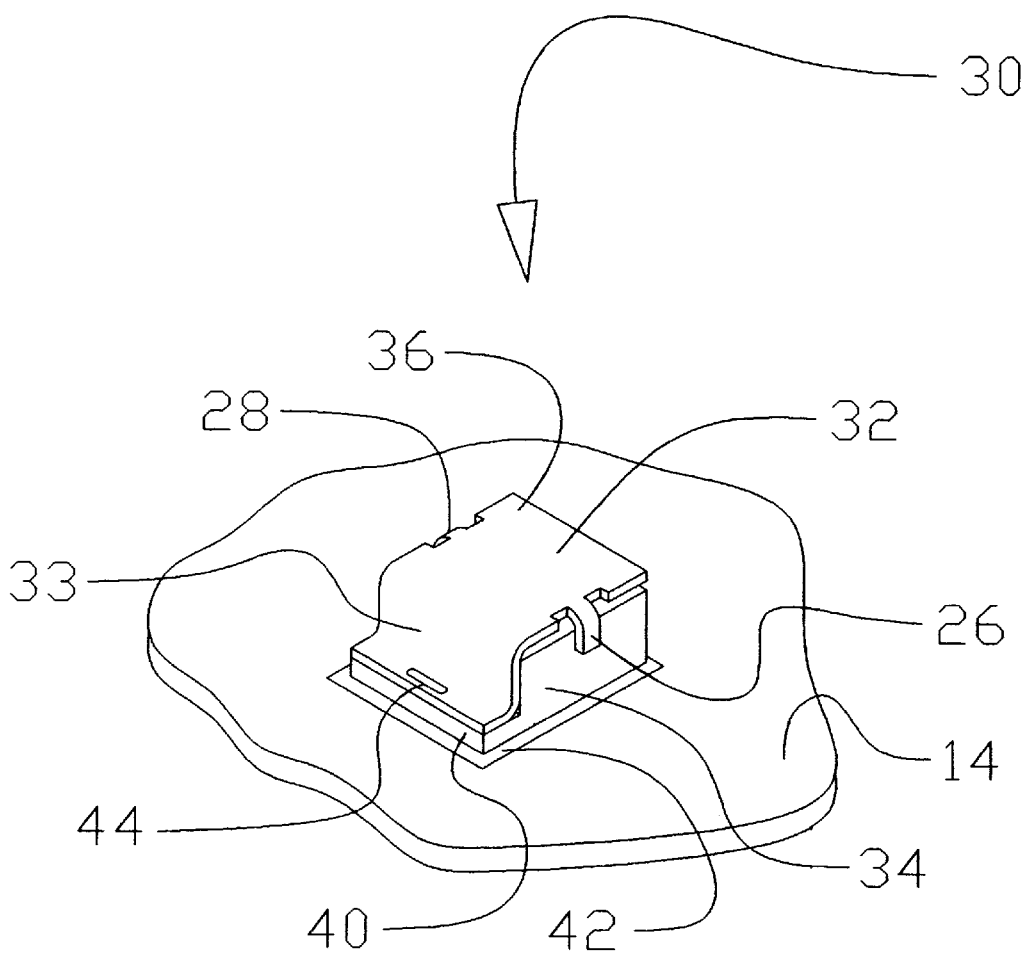
FIG. 2 is a perspective view of a heat dissipating assembly incorporating an embodiment of the heat sink of the present invention, where the thermal lead of the electronic device package is the tab of the device.

FIG. 2 shows a perspective view of the heat dissipating assembly 30 incorporating an alternate embodiment of the inventive heat sink 32. The heat dissipating assembly 30 is similar to the assembly 10 of FIG. 1. The heat dissipating assembly 30 again comprises a heat generating electronic device package 34 surface mounted to a substrate 14. The heat sink 32 is mounted directly on the electronic device package 34. The body 36 of the heat sink 32 is generally planar and the heat sink 32 incorporates two alignment legs 26,28 engaging opposite sides of the electronic device package 34. The thermal leg 38, however, extends from the body 36 of the heat sink 32 to make contact with another type of thermal lead 40. The electronic device package 34 utilizes a tab as a thermal lead 40. Electronic device packages 32 including a tab-type thermal lead are often referred to as a TO-220 package, or $D^2$ package for surface mount applications. The tab-type thermal lead 40 of electronic device package 34 is thermally connected to the thermal plane of the substrate 14 via a thermal pad 42. The thermal pad 42 is formed on the surface of the substrate 14 and is made of materials having a high coefficient of thermal conductivity such as copper. The thermal lead 40 is typically soldered to the thermal pad 42 to ensure an efficient and sturdy thermal connection.

The thermal leg 38 of the heat sink 32 is adapted to increase the amount of surface area contact between the thermal leg 38 and the thermal lead 40 of the electronic device package 34. The thermal leg 38 is shown angled or arcuate such that a portion of the thermal leg 38 is generally adjacent and parallel with a substantial portion of the thermal lead 40. In addition, the parallel portion of the thermal leg 38 is sized to approximately match the dimensions of the thermal lead 40 thereby increasing the surface area contact between them. By increasing the contact surface area between the thermal leg 38 and the thermal lead 40, a larger thermal path is achieved between the heat generating electronic device package 34 and the heat sink 32 thereby increasing the rate and amount of heat which can be dissipated. By thermally coupling the thermal leg 38 to the thermal lead 40 with thermal epoxy, adhesive, solder, etc., the efficiency and capacity of the heat dissipating assembly 30 can also be increased. To facilitate using solder or a thermal adhesive, an aperture 44 is formed in the parallel portion of the thermal leg 38 adjacent the thermal lead 40. A solder supply, such as a solder bead, solder plug, or glob of solder paste, may be placed in the aperture 44. When the heat dissipating assembly 30 is heated to reflow solder for the standard manufacturing assembly process for surface mount PCBs, the solder plug in the aperture 44 will also reflow thereby soldering the thermal leg 38 to the thermal lead 40 of the heat generating electronic device package 34. The size of the tab or thermal lead 40 of the heat generating device 34 will determine the proper amount of solder to be used in order to adequately secure the thermal leg 38 to the thermal lead 40 without having any runoff of excess solder. The thermal leg 38 provides an additional thermal connection to the heat generating device package 34 and thereby provides an increased thermal path to conduct heat away from the heat generating electronic device package 34 to the heat sink 32 for dissipation.

FIG. 3a shows a perspective view of the heat dissipating assembly 50 incorporating an alternate embodiment of the inventive heat sink 52 for use with a heat generating electronic device package 54 having two types of thermal leads 56,58. The first thermal lead 56 is a ground lead of the device package 54 which is thermally coupled to the thermal plane of the substrate 14. The second thermal lead 58 is a collector tab, or other heat dissipating tab, of the electronic device package 54. The tab-type thermal lead 58 is thermally coupled to a thermal pad 42 which is in turn thermally connected to the thermal plane of substrate 14. Corresponding to the two thermal leads 56,58, the heat sink 52 has two thermal legs 60,62. The first thermal leg 60 extends from the body 64 of the heat sink 52 to contact the first thermal lead 56 of the electronic device package 54. Similarly, the second thermal leg 62 extends from the body 64 of the heat sink 52 to contact the second thermal lead 58 of the electronic device package 54. As discussed in reference to FIG. 1 and FIG. 2, the thermal legs 60,62 and thermal leads 56,58 should be shaped and thermally coupled to maximize the surface area of contact, thereby maximizing the thermal path between the heat sink 52 and device package 54, and thus maximizing the capacity and rate of heat dissipation of the assembly 50. Also shown in FIG. 3 are alignment legs 26,28 having the same general form and function as described in reference to FIG. 1 and FIG. 2.

FIG. 3b shows a sectional view of the heat dissipating assembly 50 (as shown in FIG. 3a) incorporating an alternate embodiment of the inventive heat sink 52 for use with a heat generating electronic device package 54 having two thermal leads 56,58. The heat generating electronic device package 54 is surface mounted to the substrate 14, wherein the device package 54 includes two thermal leads 56,58. The first thermal lead 56 is a ground lead from the device package 54. The second thermal lead 58 is a tab from the device package 54. The heat sink 52 is formed to mount piggyback style on the electronic device package 54. The first thermal leg 60 of the heat sink 52 extends from the body 64 of the heat sink 52 to physically and thermally contact the first thermal lead 56 of the device package 54. Similarly, the second thermal leg 62 extends from the body 64 of the heat sink 52 to contact the second thermal lead 58 of the device package 54. Aperture 44 is shown in the second thermal leg 62.

Figure 4:
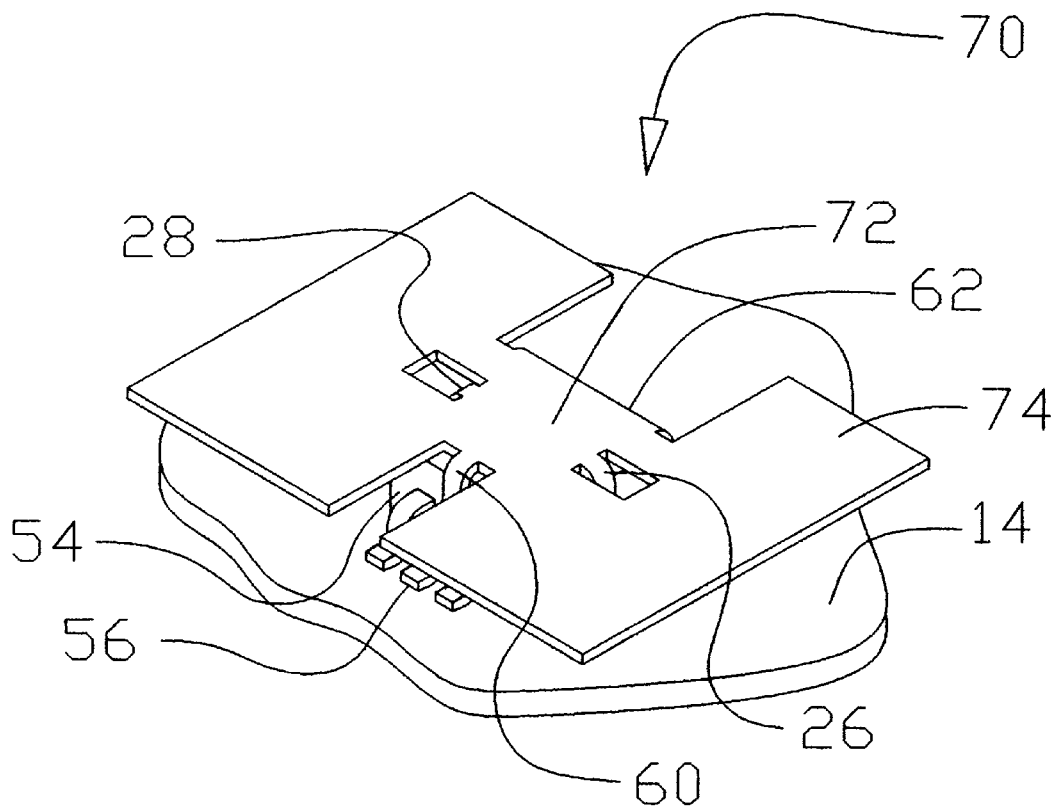
FIG. 4 is a perspective view of a heat dissipating assembly incorporating an embodiment of the heat sink of the present invention, where the surface area of the heat sink has been increased to increase the heat sink's capacity to dissipate heat.

FIG. 4 shows a perspective view of the heat dissipating assembly 70 incorporating an alternate embodiment of the inventive heat sink 72. In particular, a larger heat sink 72 having increased surface area is shown. Increasing the surface area of the heat sink 72 increases the heat sink's ability to dissipate heat to the surrounding environment, thereby increasing the capacity for heat dissipation of the assembly 70. As shown in FIG. 3, the device package 54 includes a first and second thermal lead 56,58 and the heat sink 72 incorporates a first and second thermal leg 60,62 where the thermal leads 56,58 are thermally coupled to the thermal legs 60,62, respectively. A first and second alignment leg 26,28 are shown punched, or otherwise cut, through the larger body 74 of heat sink 72 for aligning the heat sink 72 directly on the electronic device package 54. The device package 54 is again surface mounted to the substrate 14.

Figure 5:
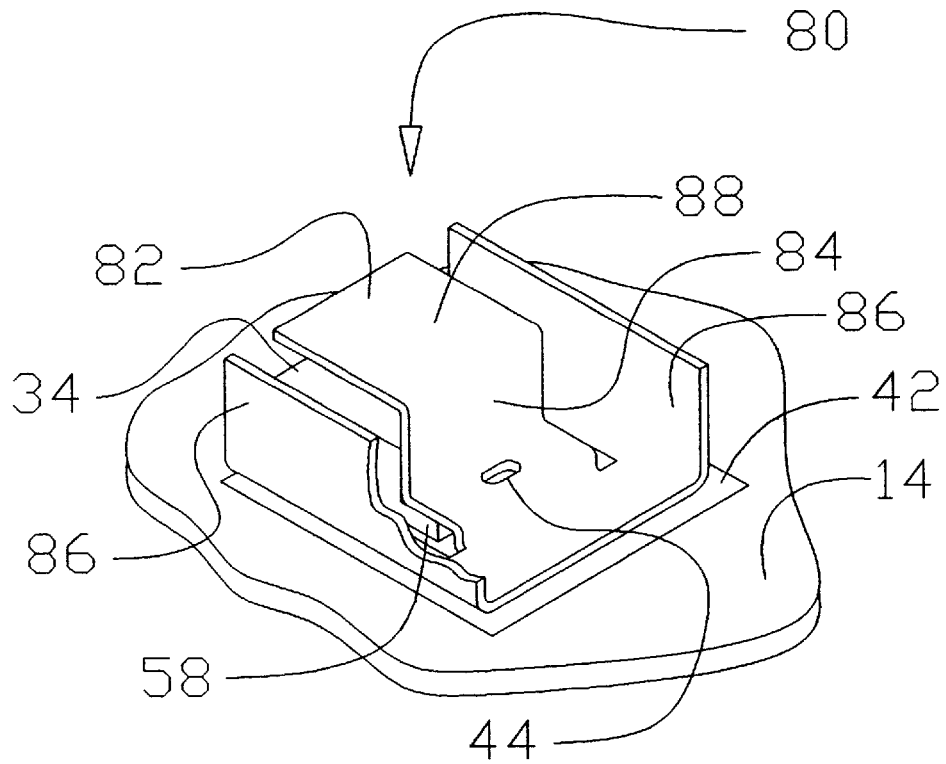
FIG. 5(*a*) is a perspective view of a heat dissipating assembly incorporating another embodiment of the heat sink of the present invention, where the thermal leg of the heat sink is thermally coupled to the thermal lead of the electronic device package and the thermal pad on the surface of the substrate.
Figure 5:
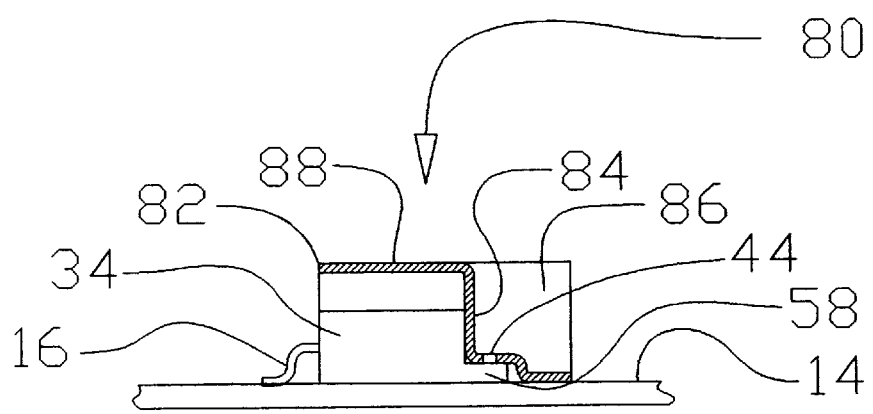

FIG. 5a shows a perspective view of the heat dissipating assembly 80 incorporating an alternate embodiment of the inventive heat sink 82. In particular, a larger heat sink 82 having increased surface area is shown. The heat sink 82 is formed to thermally connect directly to the tab-type thermal lead 58 of the electronic device package 34 as well as the thermal pad 42 on the surface of the substrate 14. In particular, the body 88 of the heat sink 82 comprises a thermal leg 84 extending therefrom. The thermal leg 84 of the heat sink 82 extends to and beyond the thermal lead 58 such that it contacts the thermal pad 42. Wings 86 extend from the thermal leg 84 of the heat sink 82 to further contact the portion of the thermal pad 42 exposed around the outside edges of the electronic device package 34. Increasing the surface area of contact between the thermal pad 42 and the heat sink 82 further increases the thermal path to transfer heat to the heat sink 82. The surface area of the heat sink 82 can be increased to accommodate the increased heat by incorporating fins, pins, etc. In fact, the wings 86 as shown in FIG. 5 extend generally upward from the thermal pad 42 on the surface of the substrate 14, thereby providing increased surface area to dissipate heat from the heat sink 82.

FIG. 5b shows a sectional view of the heat dissipating assembly 80. The heat generating electronic device package 34 is surface mounted to the substrate 14. The electrical leads 16 of the electronic device package 34 are not used as thermal leads. The electronic device package 34, however, does utilize a tab-type thermal lead 58. The heat sink 82 comprises a body 88 and a thermal leg 84 extending from the body 88. The body 88 of the heat sink 82 is generally planar and is supported above the top surface of the electronic device package 34. The thermal leg 84 of the heat sink 82 extends generally downward from the body 88 of the heat sink 82 to the thermal lead 58 of the electronic device package 34 and to the thermal pad 42 on the surface of the substrate 14. The thermal leg 84 is formed arcuate or angled such that a portion thereof is adjacent and parallel with a substantial portion of the thermal lead 58 of the electronic device package 34. The thermal leg 84 is additionally formed angled or arcuate such that another portion of the thermal leg 84 is adjacent and parallel with a substantial portion of thermal pad 42 on the substrate 14. The thermal leg 84 is in direct thermal contact with the thermal lead 58 of the electronic device package 34 and the thermal pad 42. By soldering the heat sink 82 to the thermal lead 58 and the thermal pad 42, an efficient and sturdy thermal connection is achieved. By forming the heat sink 82 to contact a substantial portion of the thermal lead 58 and the thermal pad 42, a larger thermal path to transfer heat to the heat sink 82 is formed, thereby increasing the capacity of heat dissipation for the assembly 80. Aperture 44 is formed in the portion of the thermal leg 84 adjacent and parallel to the thermal lead 58 for attaching the thermal leg 84 to the thermal lead 58 with solder, heat-conductive epoxy, or other thermal adhesives. Wings 86 extend from the thermal leg 84 to increase the surface area of contact between the heat sink 82 and the thermal pad 42. In addition, the wings 86 extend generally upward from the thermal pad 42 thereby increasing the heat sink's 82 capacity to dissipate heat.

Figure 6:
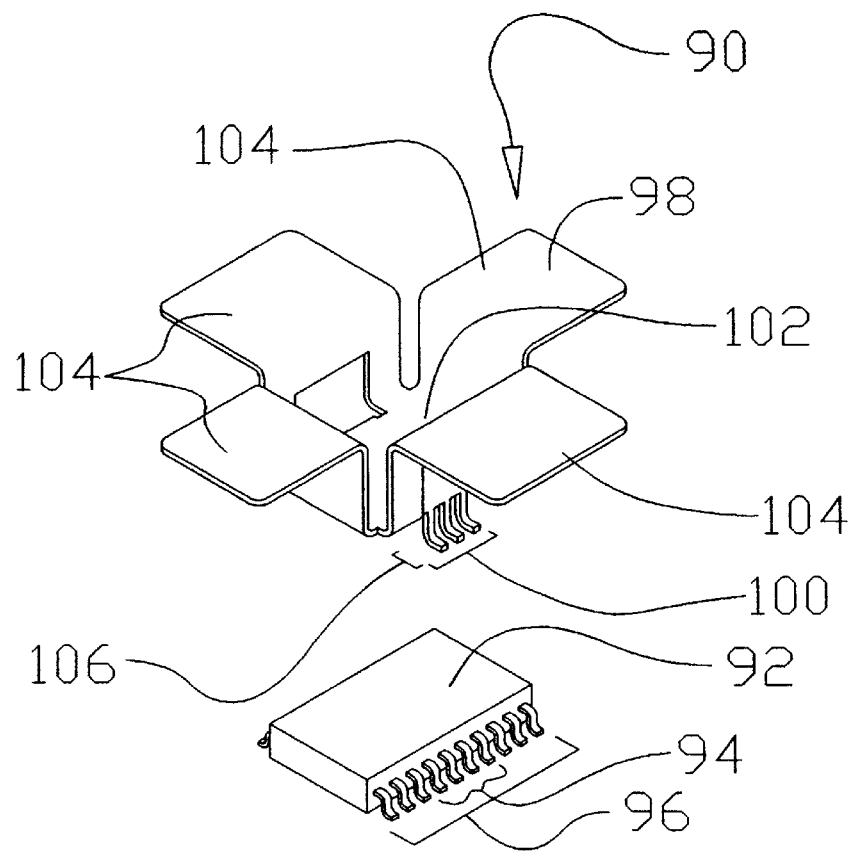
FIG. 6(*a*) is a perspective view of a heat dissipating assembly incorporating an embodiment of the heat sink of the present invention in unassembled state where the thermal legs of the heat sink extend between adjacent thermal leads of the electronic package; and, FIG. 6(*b*) is an assembled view of the heat dissipating assembly of FIG. 6(*a*).
Figure 6:
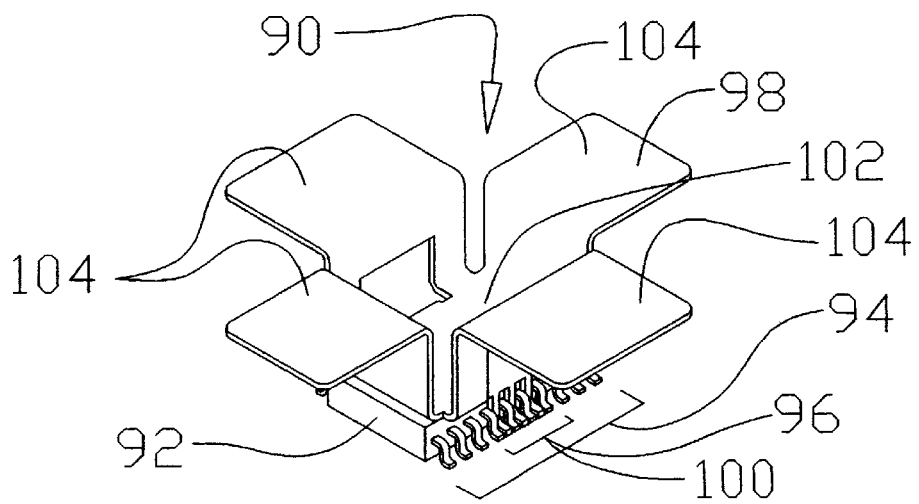

FIG. 6 shows a perspective view of an alternate embodiment of the heat dissipating assembly 90 of the present invention in unassembled (FIG. 6a) and assembled states (FIG. 6b). The heat generating electronic device package 92 is often referred to as a dip package, or SO package for surface mount applications. This type of electronic device package does not include a tab-type thermal lead. Instead, the electronic device package 92 has electrical leads 94, some of which are ground leads used as thermal leads 96. In particular, the electronic device package 92 has four thermal leads 96 adjacent to one another. Because the thermal leads 96 are adjacent, the heat sink 98 can utilize thermal legs 100 which extend between the thermal leads 96, instead of extending to contact the top surface of the thermal leads 96, as shown in FIGS. 1, 3, and 5.

The heat sink 98 has a generally planar body 102 supported above or on the top surface of the electronic device package 92. Three thermal legs 100 extend from the body 102 of the heat sink 98 to and between the thermal leads 96 of the electronic device package 92. To ensure effective thermal contact between the thermal legs 100 and the thermal leads 96, the thermal legs can be soldered or otherwise thermally attached to the thermal leads 96, being careful not to short to the other non-ground electrical leads 94. In addition, the thermal legs 100 of the heat sink 98 can be formed angled or arcuate such that they have feet 106 which can be thermally coupled to a thermal pad on the substrate 14 adjacent the thermal leads 96. The heat sink 98 also incorporates large fins 104 extending from the body 102 of the heat sink 98 to increase the heat dissipating surface area of the heat sink 98.

While the invention has been particularly shown and described with respect to specific embodiments thereof, it is to be understood that various changes in form and detail may be made hereto without departing from the spirit and scope of the present invention and shall be encompassed within the scope of the appended claims.

What is claimed is:

1. A heat sink assembly adapted to provide an increased thermal path from a surface mount heat generating electronic device package, comprising:

a substrate having a ground plane, wherein said ground plane is used for heat dissipation;

a heat generating electronic device package mounted to said substrate, having a ground lead thermally connected to said ground plane of said substrate;

a heat sink comprising a body of thermally conductive material and at least one thermal leg extending from said body, wherein at least one thermal leg of said heat sink is in direct thermal contact with said ground lead of said heat generating electronic device package; and wherein said electronic device package has multiple adjacent thermal leads, and said heat sink has at least one thermal leg extending between said thermal leads.

2. The assembly of claim 1, wherein said multiple thermal leads of said electronic device package and said at least one thermal leg of said heat sink are thermally coupled using solder.

3. The assembly of claim 1, wherein said multiple thermal leads of said electronic device package and said at least one thermal leg of said heat sink are thermally coupled using thermally enhanced adhesive.

4. The assembly of claim 1, wherein said at least one thermal leg of said heat sink is thermally coupled to a thermal pad on the surface of said substrate.

5. The assembly of claim 4, wherein said at least one thermal leg of said heat sink is formed to have feet which are soldered to a thermal pad on the surface of said substrate.

* * * * *